United States Patent [19]
Kreft

[11] Patent Number: 5,773,812
[45] Date of Patent: Jun. 30, 1998

[54] CHIP CARD CAPABLE OF BOTH CONTACT AND CONTACTLESS OPERATION INCLUDING A CONTACT BLOCK

[75] Inventor: Hans-Diedrich Kreft, Dassendorf, Germany

[73] Assignee: Angewandte Digital Elektronik GmbH, Dassendorf, Germany

[21] Appl. No.: 712,061

[22] Filed: Aug. 8, 1996

Related U.S. Application Data

[63] Continuation-in-part of PCT/DE95/00119, Jan. 28, 1995.

[30] Foreign Application Priority Data

Feb. 8, 1994 [DE] Germany .......................... 44 03 753.8

[51] Int. Cl.⁶ .................................................. G06K 19/06
[52] U.S. Cl. .......................... 235/492; 235/380; 235/487
[58] Field of Search .................................... 235/492, 375, 235/441, 439, 451, 487, 380; 902/26, 4

[56] References Cited

U.S. PATENT DOCUMENTS

| | | | |
|---|---|---|---|
| 4,701,601 | 10/1987 | Francini et al. | 235/493 X |
| 4,795,898 | 1/1989 | Bernstein et al. | 235/493 X |
| 5,206,495 | 4/1993 | Kreft | 235/492 |
| 5,438,750 | 8/1995 | Venambre | 235/492 X |
| 5,519,701 | 5/1996 | Templeton, Jr. et al. | 235/492 |
| 5,598,032 | 1/1997 | Fidalgo | 235/492 X |
| 5,671,525 | 9/1997 | Fidalgo | 235/492 X |

FOREIGN PATENT DOCUMENTS

| | | |
|---|---|---|
| 2673039 | 8/1992 | France . |
| 3935364 | 8/1990 | Germany . |
| 43-10-334-A1 | 10/1994 | Germany . |
| 9101533 | 2/1991 | WIPO . |

*Primary Examiner*—Donald T. Hajec
*Assistant Examiner*—Michael G. Lee
*Attorney, Agent, or Firm*—Horst M. Kasper

[57] ABSTRACT

A chip card capable of selectively transmitting and receiving data via contact members or in a contactless manner (i.e., transmission coils). The chip card includes a contact block which represents and additional protection for the embedded integrated circuits and can also be used as a sensitive switching element for electronic purposes. In particular, based on the function as a switching element, the electronics can be switched on and off by the card user for purposes of the remote transmission. In addition, the contact block can be exchanged and thus assures also the contact card functions, in case the contacts are worn out.

23 Claims, 5 Drawing Sheets

CHIP CARD CAPABLE OF BOTH CONTACT AND CONTACTLESS OPERATION INCLUDING A CONTACT BLOCK

CROSS-REFERENCE TO RELATED APPLICATIONS

This application is a continuation-in-part application of another international application filed under the Patent Cooperation Treaty on Jan. 28, 1995, bearing Application No. PCT/DE95/00119, and listing the United States as a designated and/or elected country. The entire disclosure of this latter application, including the drawings thereof, is hereby incorporated in this application as if fully set forth herein.

BACKGROUND OF THE INVENTION

1. Field of the Invention

The present invention relates to a method of production of a chip card with a contact block for the selective coupling of a first integrated circuit ($\mu$C), formed as a microprocessor, with a connection apparatus.

2. Brief Description of the Background of the Invention Including Prior Art

Plastic cards are known as chip cards, which exchange without contacts or with contacts energy and data with their writing and reading apparatus. These cards are employed for many applications, such as, for example, telephone cards, health cards, access control cards. A survey of such cards and their applications is compiled in three editions of the "Deutsche Fachzeitschrift Elektronik" (German Specialty Journal Electronics), Volume 93.

A chip card has become known from the German printed patent document DE-C-3,935,364, where a chip, connected to a contact field, is disposed on the chip card, and which chip card exhibits in addition coils for the voltage supply of the chips and for the exchange of data. A diode capacitor network serves for the rectification and the smoothing of the voltage induced in the coil, which voltage serves also for the supply of the chips and is guided for this purpose to a switch circuit, which switch circuit controls by way of two logical levels a further switch circuit, which further switch circuit in turn is connected to the contact field and at the terminals of the switch circuit to the chip, whereby either the signals from the coils or from the contact field are switched through at the chip.

A support element with an integrated circuit or, respectively, semiconductor chip for the incorporation in chip cards has become known from the printed patent document WO 91/01533, which support element exhibits a flexible support substrate, where several contact faces are furnished on the surfaces of the support substrate, wherein the contact faces are connected through conductor paths to connectors for the circuit. A stiffening ring, made of metal, is attached to the support substrate, wherein the stiffening ring surrounds only a part of the face of the support substrate, and where a switching circuit or, respectively, a semiconductor chip is disposed in the interior of the stiffening ring. The stiffening ring exhibits a higher bending stiffness than the flexible support substrate such that, upon bending the stiffening ring, the ring is not bent and thus the switching circuit or, respectively, the semiconductor chip is to be secured against mechanical destruction.

SUMMARY OF THE INVENTION

1. Purposes of the Invention

It is an object of the invention to modify the known chip card such that contact block of the chip card performs several functions, i.e. a connection function, a switching function for the connection, and a protection function against mechanical effects.

These and other objects and advantages of the present invention will become evident from the description which follows.

2. Brief Description of the Invention

According to the present invention, there is provided for a chip card to be inserted into a connection apparatus. A first integrated circuit is formed as a microprocessor. A connection contact is connected to the first integrated circuit for furnishing a galvanic connection of the first integrated circuit. A second integrated circuit is connected to the first integrated circuit and formed as a contactless coupling device for furnishing a contactless connection of the first integrated circuit to the connection apparatus through contact-free elements. A contact block is surrounding the first integrated circuit and the second integrated circuit for protection against mechanical effects with the contact block structured as a sensor, sensitive to physical interactions such as pressure, electrical fields, etc. An output signal of the sensor switches the first integrated circuit to a desired coupling.

Contact faces can be disposed on the contact block for connecting the connection contact to the first integrated circuit for furnishing a selective coupling of the first integrated circuit to the connection apparatus through contacts.

The contact block can be formed out of a stable core material. The contact faces can be galvanically conductive. The contact faces can be disposed at a top side of the contact block. The contact faces can reach from said top side of the contact block up to locations on an oppositely disposed bottom side of the contact block. A support foil can define openings in the support foil. A conductor path structure can be disposed on the foil and oppositely to the contact block. A galvanic connection can be disposed through the openings in the support foil and can connect the contact faces to the conductor path structure.

The contact block can have a bottom side and contain a recess at the bottom side. Said recess can serve for receiving the first integrated circuit.

The contact block can be disposed on the support foil separately from the first integrated circuit and separately from the second integrated circuit. The contact block can serve for a production of a galvanic connection between the connection apparatus and the first integrated circuit.

A mechanically stable amplifier platelet can be disposed on that side of the support foil disposed opposite to the contact block for serving as a protection against mechanical outside influences onto the integrated circuits.

The contact block can be constructed mechanically exchangeable. Connection pieces can furnish a mechanical connection to the stable strengthening platelet through the connection pieces and through second openings in the support foil. These connection pieces can furnish a galvanic connection between the contact faces of the contact block and the stable amplifier platelets. The stable strengthening platelet can contain second conductor path structures. A properly coordinated connection between the contact faces and the first conductor path structures of the support foil can be produced with said second conductor path structures. A mechanical release and attachment of the contact block to the connection pieces can be performed by a manual actuation such that the contact block is renewable upon wear of the contact faces and a functioning of the integrated circuits is assured after exchanging the contact block.

The solution of the object according to the invention of a chip card for the selective coupling of a first integrated circuit, formed as microprocessor, for the galvanic coupling through connection contacts with a card connection apparatus and a second integrated circuit for the contact-free connection with the card connection apparatus comprises that the connection contacts are disposed on a contact block. The contact block exhibits at its bottom side a recess, which recess serves for the reception of at least one of the two integrated circuits for the protection against mechanical effects. The contact block is placed onto a support foil. The support foil exhibits on its bottom side, disposed oppositely to the contact block, a conductor path structure made of coil windings or of capacitor plates for the contact-free coupling of the second integrated circuit with the card connection apparatus. The connection contacts are furnished at a top side of the contact block as galvanically conductive contact faces for the galvanic connection of the contact block to the card connection apparatus. The contact faces reach from this top side of the contact block up to locations on the oppositely disposed bottom side of the contact block. Openings are provided in the support face at the locations, where the connection contacts of the integrated circuits and of the contact faces come to rest on the bottom side of the contact block upon bringing together the support foil and the integrated circuits as well as the contact blocks. Said openings are provided for the contacting of the integrated circuits over galvanic connections through the openings of the support foil.

The contact block of the chip card thus fulfills in an advantageous way several functions, namely a connection function, a protection function against mechanical effects, as well as a switching function for the purpose of a connection.

The novel features which are considered as characteristic for the invention are set forth in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

In the accompanying drawings, in which are shown several of the various possible embodiments of the present invention.

DESCRIPTION OF INVENTION AND PREFERRED EMBODIMENT

Figure 1:
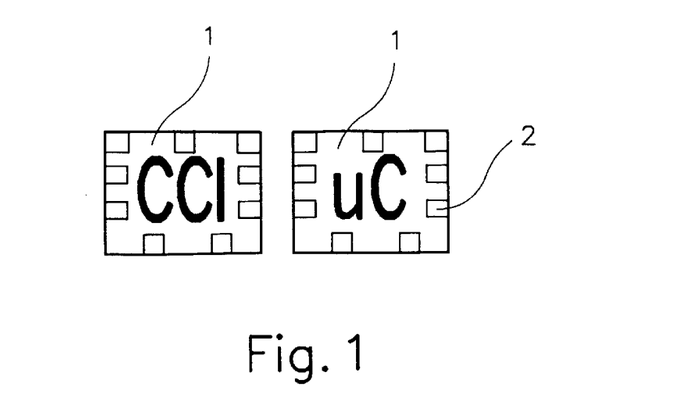
FIG. 1 is a schematic top planar view of two integrated circuits, where one integrated circuit serves as microprocessor and the second integrated circuit serves as contactless coupling device.

Two integrated circuits are shown in FIG. 1, wherein one is constructed as a microprocessor $\mu C$, and wherein the second one is formed as a contact-free coupling device CCI. The integrated circuits usually comprise a chip body 1 with semiconductor properties and connection contacts 2, which can be employed for example for bonding connections. The CCI coupling device produces the contact-free coupling of the microprocessor $\mu C$ to its environment. The coupling can be performed inductively, capacitively, or in another contact-free fashion. The functions of the coupling device CCI can also be integrated into the microprocessor $\mu C$ such that a single-chip solution results.

Figure 2:
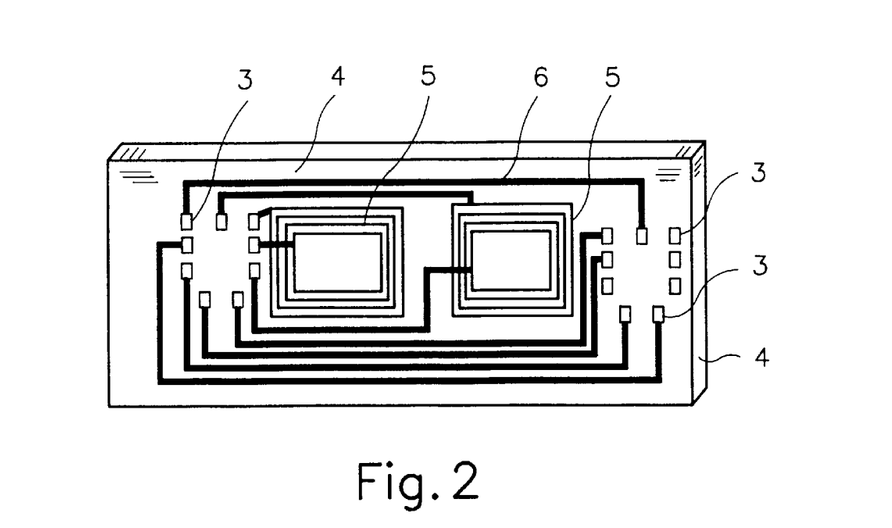
FIG. 2 is a schematic planar view of a bottom side of a support foil with the conductor path structure for a contact-free coupling.

The bottom side of the support foil 4 with the conductor path structure 6 and the coil windings 5 for the contact-free coupling is shown in FIG. 2. Instead of the coil windings, capacitor plates for the contact-free coupling could also be present on the foil 4. Openings 3 are contained at the positions in the foil 4, at which positions the connection contacts 2 of the integrated circuits are to be positioned upon a bringing together of foil 4 and integrated circuits.

Figure 3:
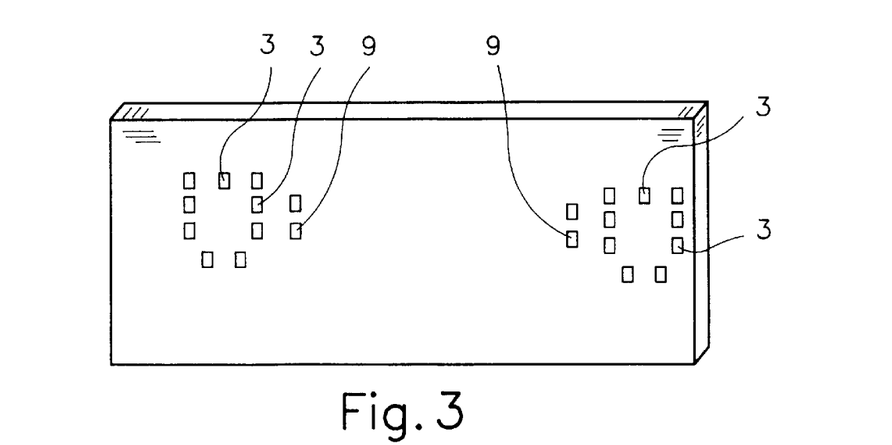
FIG. 3 is a perspective to view of the support foil, where openings and additional foil openings can be recognized.

The top side of the foil 4 is shown in FIG. 3. There are openings 3 and additional foil openings 9 recognizable in FIG. 3. The integrated circuits come to rest on the top side of the foil 4.

Figure 4:
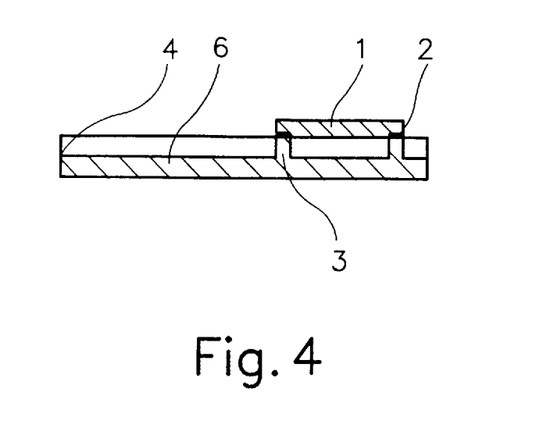
FIG. 4 is a sectional view of the support foil and the integrated circuit, wherein an integrated circuit is placed on the top side of the support foil.

A foil 4 and an integrated circuit 1 are shown in cross-section in FIG. 4. An integrated circuit 1 is applied at the top side of the foil 4. The connection contacts 2 are positioned adapted to the openings 3 such that a galvanic connection can be provided between the chip 1 over the connection contacts 2 through the openings 3 with the conductor path structure 6. The production of these conductor path structures 6 occurs advantageously according to an additive method. Initially, a catalytic material is applied as a pressure pattern of the conductor connections on the foil 4. Subsequently, a conductor, such as copper or aluminum, is deposited at the positions of the catalytic material in a chemical bath.

Figure 5:
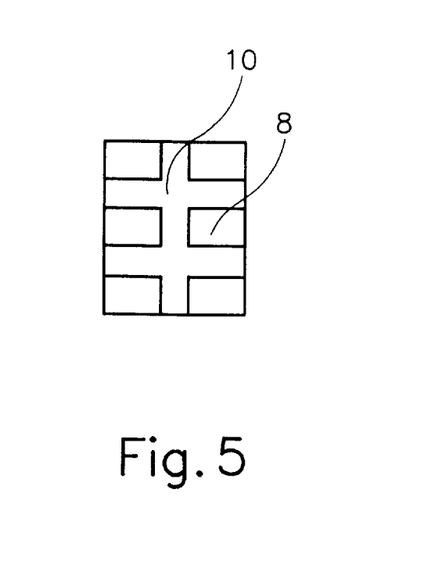
FIG. 5 is a schematic top view onto the contact block.

FIG. 5 shows a contact block in a top view containing the stable core material 10 with contact faces 8 for a galvanic connection with card connection apparatuses.

Figure 5A:
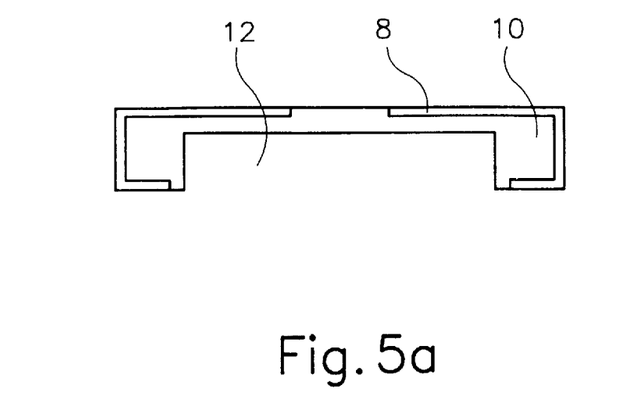
FIG. 5a is a schematic side view of the contact block.

FIG. 5a shows the contact block in the side view. The material of the contact faces surrounds the core material 10 such that a galvanic connection is generated between the top side and the bottom side. The locations, at which the foil openings 9 come to be disposed, are furnished with conductive material. A recess 12 for receiving the integrated circuit 1 is placed in the core material 10.

A mechanically stable contact block 10, 8 comprises integrated circuits in the recess 12, wherein the integrated circuits are mechanically protected based on the stability of the contact block 10, 8. The contact block 10, 8 contains galvanically conducting material on its top side, where the galvanically conducting material is provided on the top side as contact faces 8 for the contact-containing chip cards. The contact faces 8 serve as a connection between card connection apparatuses outside of the card and the integrated circuits, which integrated circuits are contained in the recess 12. A further integrated circuit CCI, serving as a contactless coupling and connected with the coils 5 or capacitors, is protectedly disposed under the contact block 10, 8. This second integrated circuit CCI produces the contact-free coupling to card connection apparatuses outside of the chip card.

Because the surface of the contact block 10, 8 is connected at the same time, for example, as a capacitively sensitive face to the base of a field effect transistor in the second integrated circuit, the contact block 10, 8 serves as a switch upon a capacitive charge change of the surface of the contact block. Thus, the contact block 10, 8 fulfills the additional function of a switch. For example, contact-free functions of the card can be switched on and off by the owner of the card with the aid of the switch. This can be advantageous in cases, where the contact-free remote access is to be excluded.

It is important that the second integrated circuit can be disposed below the contact block 10, 8, which further integrated circuit serves for furnishing contactless coupling and thus is connected to coils 5 or capacitors. The contact block 10, 8 furnishes the contact-free coupling to the connection apparatus outside of the chip card. This additional integrated circuit with the coupling with other connection apparatuses outside of the chip card appears to be of particular importance in the realization of the present invention.

Figure 6:
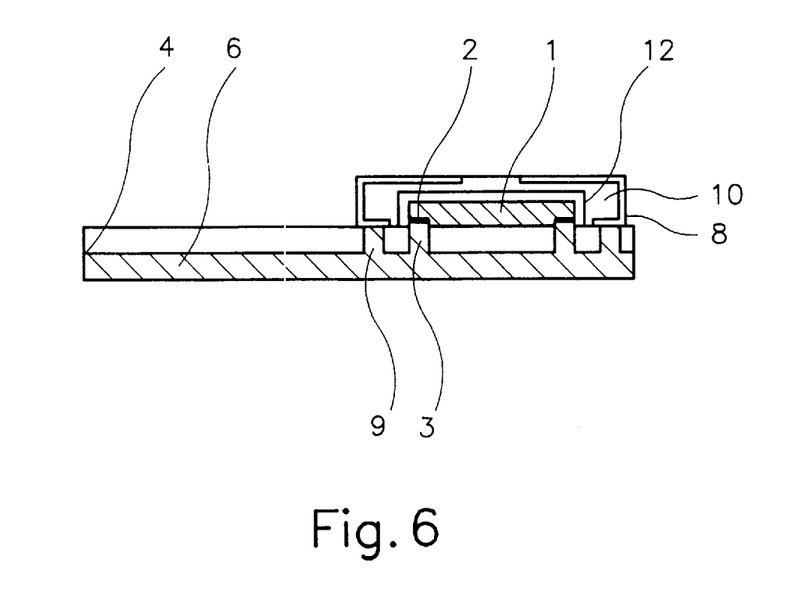
FIG. 6 is a sectional view and combination of the FIGS. 4 and 5 with the contact block, the support foil, and the integrated circuit shown in a single figure.

The contact block 10, 8, foil 4 and integrated circuit 1 are shown in FIG. 6 in a single figure representing a sectional view and combination of the FIGS. 4 and 5. FIG. 6 shows at the same time a first embodiment according to the present invention. The contact block with its recess 12 is disposed above the integrated circuit 1 and operates through its mechanically stable structure as a protection against mechanical effects for the integrated circuit 1. At the same time, the galvanic conductive faces 8 produce with their conductor path structure 6 a connection between the top side of the contact block 10, 8 and the bottom side of the foil 4. The recited additional openings 9 serve for this purpose according to the present patent. The signals are connected from the top side of the contact block 10, 8 to the conductor path structure 6 according to this embodiment and the signals can be led thereby to the connection contacts 2 of the integrated circuits.

Figure 7:
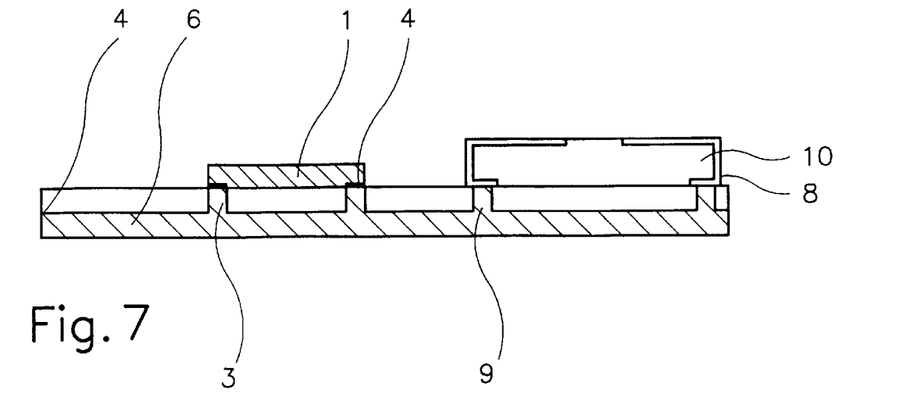
FIG. 7 is a schematic view, where the integrated circuit and the contact block are separated.

An embodiment can be recognized from FIG. 7, where the integrated circuits and the contact block 10, 8 are disposed spatially separated. The contact block 10, 8 represents no longer an additional security for the integrated circuits 1, however, the contact block 10, 8 can be further used as a switch, where the switch is disposed at the locations, where usually the contact faces are present in case of contact-containing cards.

Figure 8:
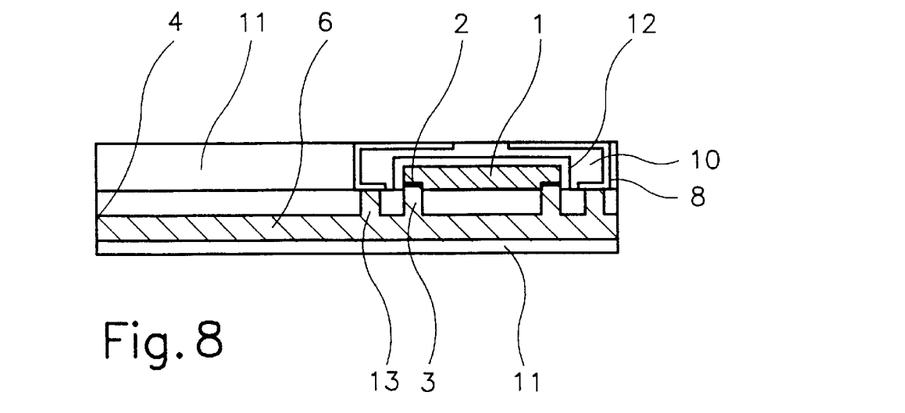
FIG. 8 is a sectional view illustrating the embedding of the elements of FIG. 6 into the plastic material of a card body.

The embedding of the elements of FIG. 6 into the plastic material of a card body 11 is shown in FIG. 8.

Figure 9:
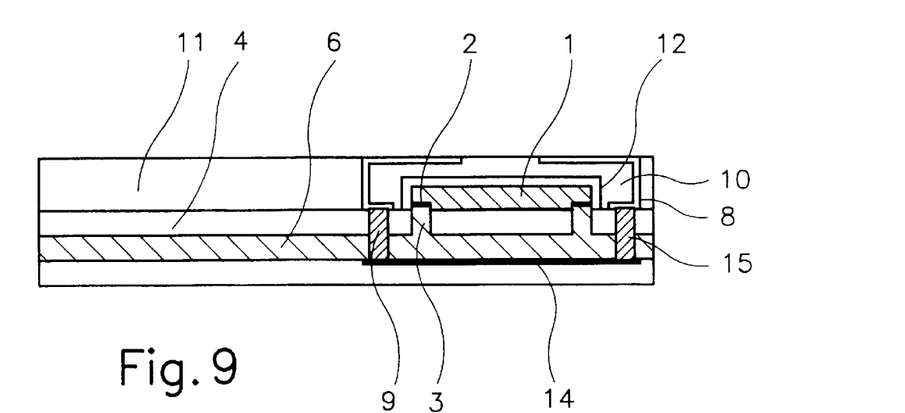
FIG. 9 is a sectional view illustrating the embedding of the elements of FIG. 6 into the plastic material of a card body, wherein an amplifier platelet is in addition embedded into the card body.

FIG. 9 shows the embedding of the elements of FIG. 6 into the plastic material of a card body 11. In addition, an amplifier platelet 14 is entered below the support foil 4 and the integrated circuits 1 into the card body 11, where the amplifier platelet 14 protects the unprotected side of the integrated circuit against mechanical interactions. Mechanical connection pieces 15 are solidly mounted onto the amplifier platelets 14 for maintaining a mechanical distance upon pressure impact onto the contact block 10, 8. The lower contact faces of the contact block 10, 8 rest on these connection pieces 15, whereby galvanically conducting connections are furnished between the contact faces of the contact block 10, 8 and the amplifier platelet 14. In addition, the amplifier platelet 14 can further lead this connection to conductor path structure 6 of the foil 4, whereby a connection between the contact faces of the contact block 10, 8 and the integrated circuit is furnished. The advantage results thereby that the contact block 10, 8 can be disposed exchangeably, since the connection between the contact fields of the contact block and the integrated circuit are no longer provided by the galvanizing material, but by a connection element between the contact block 10, 8 and the amplifier platelet 14. The amplifier platelet 14, which remains unchanged with its mechanical connection pieces 15 upon an exchange of the contact block 10, 8, assures thereby the perfect and undisturbed connection between the integrated circuit and the contact faces of the contact block 10, 8. The connection pieces 15 are led through additional holes 9 in the foil 4, as illustrated in FIGS. 2 and 3.

The contact block 10, 8 is constructed exchangeably, as illustrated in FIG. 9. For this purpose, the amplifier platelet 14 with its connection pieces 15 is connected mechanically or, for example, magnetically to the exchangeable contact block 10, 8. The amplifier platelet 14 provides additionally the connection of the contact faces 8 of the contact block 10, 8 to the conductor path structures 6 of the foil 4. It is thus possible to exchange the contact block 10, 8 in the case of damaged or worn contact faces 8 and to assure the perfect contacting of the integrated circuits and of the connection apparatuses outside of the card.

Figure 10:
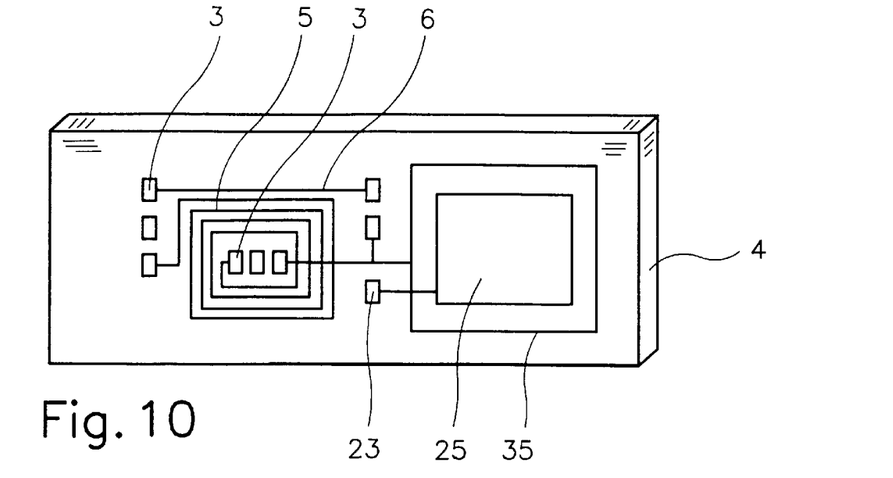
FIG. 10 is a schematic planar view of the bottom side of a support foil similar to FIG. 2, wherein however openings are disposed inside and outside of coil windings and further including a capacitor.
Figure 11:
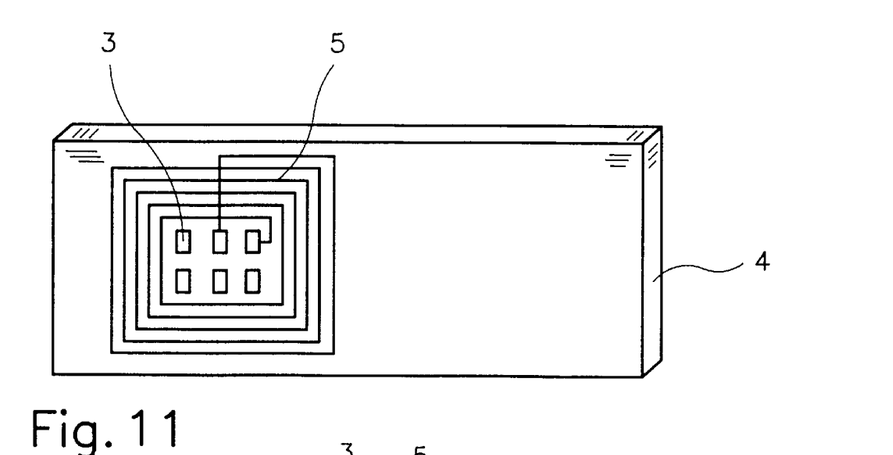
FIG. 11 is a schematic planar view of the bottom side of a support foil similar to FIG. 2, wherein however openings are disposed inside of the coil winding.

Alternative structures of conductor paths in a support foil are shown in FIGS. 10 and 11.

FIG. 10 shows the bottom side of the support foil 4 with the conductor path structure 6 and the coil windings 5 for the contact-free coupling. Openings 3 are contained at the positions in the foil 4, at which positions the connection contacts 2 of the integrated circuits are to be positioned upon a bringing together of foil 4 and integrated circuits. Some openings 3 are disposed inside of the coil windings 5 and some openings 3 are disposed outside of the coil windings 5 depending on geometrical considerations, effectiveness considerations, and electrical interference consideration.

On the right hand side of FIG. 10, there is shown a capacitor plate 25 for the contact-free coupling on the foil 4 instead of the coil windings. An annular conductor path structure 35 surrounds the capacitor plate 25 for reference purposes. The capacitor plate 25 and the annular conductor path structure 35 are connected to respective openings 3 outside of the annular conductor path structure 35.

FIG. 11 shows a coil winding 5, where the openings 3 for furnishing connection are all disposed in projection geometrically inside of the coil winding 5.

Thus, in general the coil windings 5 are disposed on the support foil 4 below the contact or, respectively, below the contact block 10, 8. While FIG. 2 shows that the connection of the coils are placed on the side next to the coil, FIG. 11 shows that the connections of the coil 5 are placed inside of the coil 5 when viewed along the coil axis.

Figure 12:
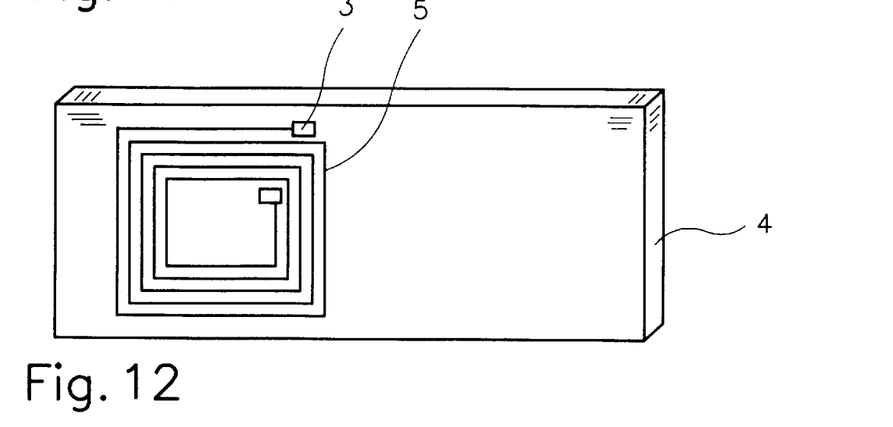
FIG. 12 is a schematic planar view of the bottom side of a support foil similar to FIG. 2, wherein however openings are disposed immediately above the respective ends of the coil winding.

It is further important that these connections can also be disposed directly above the coils 5, which constructions are associated with advantages. In this case shown in FIG. 12, the electromagnetic field of the coils 5 can better penetrate the contacts. The openings 3 are disposed according to FIG. 12 immediately above the ends of the winding 5 forming the coil shown in FIG. 12. The structure of the coil windings 5 and of the openings 3 according to FIG. 12 of course does not exclude the other structures disclosed in the present application. However, the disposition of the contacts immediately above the coils 5 in their projection is illustrated in FIG. 12 as a particularly advantageous embodiment.

According to the present invention, it is possible that the contact connections are present immediately above the coils 5 or slightly staggered relative to the coils 5. The various geometrical dispositions of coil windings 5 relative to connection openings 3 are part of the present invention.

Chip cards on the market are associated with the disadvantage of the wear of the contact faces. In chip cards, which are furnished with a contact block described according to the patent, a worn contact block can be exchanged. Chip cards with their extensive memory information are thus maintainable for a longer time.

It will be understood that each of the elements described above, or two or more together, may also find a useful application in other types of chip cards differing from the types described above.

While the invention has been illustrated and described as embodied in the context of a combined chip card, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A chip card to be inserted into a connection apparatus comprising
    a first integrated circuit formed as a microprocessor;
    a connection contact connected to the first integrated circuit for furnishing a galvanic connection of the first integrated circuit;
    a second integrated circuit connected to the first integrated circuit and formed as a contactless coupling device for furnishing a contactless connection of the first integrated circuit to the connection apparatus through contact-free elements;
    a contact block surrounding the first integrated circuit and the second integrated circuit for protection against mechanical effects with the contact block structured as a sensor, sensitive to physical interaction, wherein an output signal of the sensor switches the first integrated circuit to a contact or contactless coupling.

2. Chip card according to claim 1, further comprising contact faces disposed on the contact block for connecting the connection contact to the first integrated circuit for furnishing a selective coupling of the first integrated circuit to the connection apparatus through contacts.

3. Chip card according to claim 2, wherein the contact block is formed out of a stable core material, wherein the contact faces are galvanically conductive, and wherein the contact faces are disposed at a top side of the contact block, wherein the contact faces reach from said top side of the contact block up to locations on an oppositely disposed bottom side of the contact block, further comprising
    a support foil defining openings in the support foil;
    a conductor path structure disposed on the foil and disposed oppositely to the contact block;
    a galvanic connection disposed through the openings in the support foil and connecting the contact faces to the conductor path structure.

4. Chip card according to claim 3, wherein the contact block has a bottom side and contains a recess at the bottom side, which recess serves for receiving the first integrated circuit.

5. Chip card according to claim 4, wherein the contact block is disposed on the support foil separately from the first integrated circuit and separately from the second integrated circuit, and wherein the contact block serves for a production of a galvanic connection between the connection apparatus and the first integrated circuit.

6. Chip card according to claim 3, further comprising a mechanically stable amplifier platelet disposed on that side of the support foil disposed opposite to the contact block for serving as a protection against mechanical outside influences onto the integrated circuits.

7. Chip card according to claim 3, wherein the contact block is constructed mechanically exchangeable, further comprising
    a strengthening platelet;
    connection pieces furnishing a mechanical connection to the stable strengthening platelet through the connection pieces and through second openings in the support foil, whereby these connection pieces furnish a galvanic connection between the contact faces of the contact block and the stable amplifier platelets, and wherein the stable strengthening platelet contains second conductor path structures, wherein a properly coordinated connection between the contact faces and the first conductor path structures of the support foil are produced with said second conductor path structures, wherein a mechanical release and attachment of the contact block to the connection pieces is performable by a manual actuation such that the contact block is renewable upon wear of the contact faces and a functioning of the integrated circuits is assured after exchanging the contact block.

8. Chip card according to claim 1, wherein the physical interaction is provided by pressure.

9. Chip card according to claim 1, wherein the physical interaction is provided by electrical field.

10. Chip card with a contact block for the selective coupling of a first integrated circuit ($\mu$C), formed as a microprocessor, with a connection apparatus through contacts (according to ISO 7816) or contact-free elements (according to ISO 10536), wherein a contact block (10, 8)
    exhibits a connection contact (2) for a galvanic connection of the first integrated circuit ($\mu$C) to the connection apparatus,
    contains a second integrated circuit (CCI), formed as a contactless coupling device, for a contactless connection of the first integrated circuit ($\mu$C) to the connection apparatus,
    includes the two integrated circuits ($\mu$C+CCI) for protection against mechanical effects, and
    is structured as a sensor, sensitive to physical interaction, wherein an output signal of the sensor switches the first integrated circuit ($\mu$C) to a contact or contactless coupling.

11. Chip card according to claim 10, wherein the contact block (10, 8) is formed out of a stable core material (10), which comprises galvanically conductive contact faces (8) at a top side, wherein the contact faces (8) reach from said top side of the contact block up to locations on an oppositely disposed bottom side, wherein additional openings (9, 13) are present in a support foil (4), wherein a galvanic connection exists through the additional openings (9, 13) in the support foil (4) to a conductor path structure (6) on a foil-side, disposed oppositely to the contact block (10, 8).

12. Chip card according to claim 11, wherein the contact block (10, 8) contains a recess (12) at its bottom side, which serves for a reception of integrated circuits.

13. Chip card according to claim 12, wherein the contact block is disposed on the foil (4) separately from the integrated circuits and serves for producing a galvanic connection between the connection apparatus and the first integrated circuit ($\mu$C).

14. Chip card according to claim 11, wherein a mechanically stable amplifier platelet (14), serves as a protection against mechanical outside influences onto the integrated circuits ($\mu$C and CCI), and is disposed on a side of the foil (4), which side is disposed opposite to the contact block (10, 8).

15. Chip card according to claim 11, characterized in that the contact block (10, 8) is mechanically exchangeable, wherein a mechanical connection is present to a stable amplifier platelet (14) through connection pieces (15) and through openings (9) in the foil (4), whereby these connection pieces (15) furnish a galvanic connection between the contact faces (8) of the contact block and the stable amplifier platelets (14), and wherein the stable amplifier-platelet (14) contains the conductor path structures (6), wherein a properly coordinated connection between the contact faces (8) and the conductor path structures (6) of the foil (4) are produced with said conductor path structures (6), wherein a mechanical release and attachment of the contact block to the connection pieces can be performed by a manual actuation such that, upon wear of the contact faces (8), the contact block can be renewed and a function of the integrated circuits is assured after exchange of the contact block.

16. A chip card for a selective coupling of a first integrated circuit ($\mu$C), formed as a microprocessor, for a galvanic connection through connection contacts (8) to a card connection apparatus, and of a second integrated circuit (CCI) for a contact-free connection with the card connection apparatus, wherein the connection contacts (8) are disposed on a contact block (10, 8), wherein the contact block (10, 8) exhibits at its bottom side a recess (12), which recess (12) serves for receiving at least one of the two integrated circuits ($\mu$C, CCI) for protection against mechanical interactions, and wherein the contact block (10, 8) is placed onto a support foil (4), wherein the support foil (4) exhibits on its bottom side, disposed oppositely to the contact block (10, 8), a conductor path structure (6) made of coil windings (5) or of capacitor plates for a contact-free coupling of the second integrated circuit (CCI) to the card connection apparatus, whereby the connection contacts (8) are formed at a top side of the contact block (10, 8) as galvanically conductive contact faces (8) for the galvanic connection of the contact block (10, 8) to the card connection apparatus, and wherein the contact faces (8) reach from said top side of the contact block (10, 8) up to locations on an oppositely disposed bottom side of the contact block (10, 8), and wherein openings (3, 9) are provided in the support foil (4) at locations, where the connection contacts (2) of the integrated circuits and of the contact faces (8) come to rest on the bottom side of the contact block (10, 8) upon bringing together the support foil (4) and the integrated circuits as well as the contact block (10, 8), wherein said openings (3, 9) are provided for contacting the integrated circuits ($\mu$C, CCI) over galvanic connections of the conductor path structure (6) through the openings (3, 9) in the support foil (4).

17. Chip card according to claim 16, wherein the contact block (10, 8) comprises a stable core material (10).

18. Chip card according to claim 16, wherein on the side of the support foil (4), onto which side of the support foil (4) the conductor path structure (6) is applied, there is disposed a mechanically stable amplifier platelet (14) for protection against mechanical outside influences, which amplifier platelet (14) is disposed opposite to the contact block (10).

19. Chip card according to claim 18, wherein connection pieces (15) are disposed between the contact block (10, 8) and the amplifier platelet (14) for a mechanical exchange of the contact block (10, 8), wherein the connection pieces (15) form a galvanic connection between the contact faces (8) of the contact block (10, 8) and the amplifier platelets (14) through the opening (9) in the support foil (4).

20. Chip card according to claim 19, wherein the amplifier platelet (14) contains conductor path structures (6), which conductor path structures (6) form a properly coordinated connection between the contact faces (8) of the contact block (10, 8) and the conductor path structures (6) of the support foil (4).

21. Chip card according to claim 18, wherein the contact block (10, 8) is formed as a sensor, sensitive to physical interactions such as pressure, electrical fields, etc., wherein an output signal of the sensor switches the first integrated circuit ($\mu$C) to a desired coupling.

22. Chip card according to claim 18, wherein the two integrated circuits ($\mu$C, CCI) are integrated into a single chip.

23. Chip card for the selective coupling of a first integrated circuit ($\mu$C), formed as a microprocessor, for a galvanic connection through connection contacts (8) with a card connection apparatus, and of a second integrated circuit (CCI) for a contact-free connection with the card connection apparatus, wherein the connection contacts (8) are disposed on a contact block (10, 8), wherein the contact block (10, 8) exhibits a recess (12) on its bottom side, and wherein the contact block (10, 8) is placed onto a support foil (4), wherein the support foil (4) exhibits on its bottom side, disposed oppositely to the contact block (10, 8), a conductor path structure (6) made of coil windings (5) or of capacitor plates for a contact-free coupling of the second integrated circuit (CCI) to the card connection apparatus, and wherein the contact block (10, 8) is placed separate from the integrated circuits ($\mu$C, CCI) on the support foil (4), wherein the connection contacts (8) on a top side of the contact block (10, 9) are formed as galvanically conducting contact faces (8) for the galvanic connection of the contact block (10, 8) to the card connection apparatus, and wherein the contact faces (8) reach from said top side of the contact block (10, 8) up to locations on the oppositely disposed bottom side of the contact block (10, 8), and wherein openings (3, 9) are provided in the support foil (4) at those locations, where the connection contacts (2) of the integrated circuits and of the contact faces (8) come to rest on the bottom side of the contact block (10, 8) upon bringing together the support foil (4) and the integrated circuits as well as the contact block (10, 8), wherein said openings (3, 9) are provided for contacting the integrated circuits ($\mu$C, CCI) over galvanic connections through the openings (3, 9) in the support foil (4).

\* \* \* \* \*